United States Patent [19]

Ozaki

[11] Patent Number: 5,428,356

[45] Date of Patent: Jun. 27, 1995

[54] VARIABLE LENGTH CODE DECODER UTILIZING A PREDETERMINED PRIORITIZED DECODING ARRANGEMENT

[75] Inventor: Nozomu Ozaki, Kanagawa, Japan

[73] Assignee: Sony Corporation, Tokyo, Japan

[21] Appl. No.: 124,504

[22] Filed: Sep. 21, 1993

[30] Foreign Application Priority Data

Sep. 24, 1992 [JP] Japan .................................. 4-255034

[51] Int. Cl.⁶ .............................................. H03M 7/40
[52] U.S. Cl. .......................................... 341/67; 341/65
[58] Field of Search ...................................... 341/65, 67

[56] References Cited

U.S. PATENT DOCUMENTS

| 4,509,038 | 4/1985 | Hirano .................... | 341/67 |
| 4,616,211 | 10/1986 | Ross et al. .............. | 341/67 |
| 4,899,148 | 2/1990 | Sato et al. .............. | 341/65 |
| 4,899,149 | 2/1990 | Kahan ..................... | 341/67 |
| 5,032,838 | 7/1991 | Murayama et al. ........ | 341/67 |
| 5,229,863 | 7/1993 | Kao et al. ............... | 358/426 |
| 5,280,349 | 1/1994 | Wang .................... | 358/133 |

FOREIGN PATENT DOCUMENTS 0493086 7/1992 European Pat. Off. .
4217008 8/1993 Germany .

*Primary Examiner*—Marc S. Hoff
*Attorney, Agent, or Firm*—William S. Frommer; Alvin Sinderbrand

[57] ABSTRACT

In a Huffman code decoder for decoding a Huffman code into data, a high speed variable length code decoder including a first decoder circuit for decoding a leading Huffman code of a Huffman code string and a second decoder circuit for decoding a consecutive string of two Huffman codes from the leading portion of the Huffman code string in which two data can be decoded by one decoder operation.

10 Claims, 4 Drawing Sheets

VARIABLE LENGTH CODE DECODER UTILIZING A PREDETERMINED PRIORITIZED DECODING ARRANGEMENT

BACKGROUND OF THE INVENTION

1. Field of the Invention

The present invention relates to a variable length code decoder for decoding a variable length code such as a Huffman code or the like and which is suitable for use in transmitting image data and audio data in the form of compressed data.

2. Description of the Prior Art

When a large amount of data such as image data or the like is transmitted by using a communication network whose data transfer capability is limited or when image data of a long period of time is recorded on a storage medium of a small storage capacity and so on, bit-rate reduction technologies may be utilized for reducing the data amount.

With regard to the bit-rate reduction technology, many technologies have heretofore been developed and put into practical use, such as a DCT (discrete cosine transform) coding technique in which image data, for example, is cosine-transformed and then compressed by using a coefficient thereof and a variable length coding technique in which an overall code amount is reduced by varying a length of a corresponding code in accordance with a frequency at which data is produced.

As an example of a variable length coding, there is proposed a Huffman coding. The fundamental concept of Huffman coding is that an average code length (or total code amount) is reduced by assigning a code of a short code length to an event (data) appearing with high frequency and by assigning a code of a long code length to an event appearing with low frequency to thereby compress data.

The system in which Huffman codes corresponding to respective event(s) in actual practice are generated depends upon the probability that the respective events occur. How to generate the Huffman code on the basis of statistics data of events had been described in various books under the title of information theory and therefore need not be described herein. In order to understand the present invention more clearly, a simple Huffman code corresponding to the following five data ("0", "1", "2", "3", "4") will be described. In the above-mentioned five data, more frequently occurring data, such as data having relatively small values, is represented by Huffman codes having a fewer number of digits as compared to data which occurs less frequently. As a result, such data may have the following Huffman code:

| Data | Huffman code |
| --- | --- |
| "0" | [    1] |
| "1" | [   01] |
| "2" | [  001] |
| "3" | [ 0001] |
| "4" | [00001] |

By way of example, a Huffman code string having a data sequence of "2", "3", "0", "1", "3", "0", "4" is expressed as:

[00100011010001100001]

This data is output sequentially from the left-hand side.

FIG. 1 of the accompanying drawings shows an example of a conventional Huffman decoder for decoding the Huffman code.

As shown in FIG. 1, a Huffman code string is supplied to an input terminal 1. The Huffman code string is input to the input terminal 1 in the form of one bit serial data or in the unit of bytes or words depending upon a system bus width and an input and output method.

The Huffman code string from the input terminal 1 is temporarily stored in an n-bit register 2 where n is a value larger than a maximum length m of the Huffman code. Of the n-bit stored in the n-bit register 2, the m-bit indicative of the maximum length of the Huffman code is supplied to a decoder circuit 4 by a barrel shifter 3.

The barrel shifter 3 can shift the input code string during a constant time regardless of the number of bits to be shifted and is capable of high speed processing as compared with a shift register that shifts one bit by one clock pulse.

The decoder circuit 4 is comprised of a read-only memory (ROM), a programmable logic array (PLA), a logic gate or the like, though not shown. When the input signal becomes coincident with the Huffman code, the decoder circuit 4 outputs a hit signal at a hit signal output terminal 4a and also outputs decoded data at a data output terminal 5. Further, the decoder circuit 4 outputs a code length signal indicative of a length of Huffman code at that time to a code length signal output terminal 4b.

The hit signal developed at the hit signal output terminal 4a is supplied to a Huffman code decoder controller 6. The controller 6 supplies the decoded data of Huffman code to the next stage in response to the hit signal. The code length signal developed at the code length signal output terminal 4b is supplied to a shift controller 7 and the barrel shifter 3 is operated under the control of the shift controller 7 to supply the next input signal to the decoder circuit 4. When the Huffman signal becomes coincident with the input signal again, the decoder circuit 4 is operated similarly as described above to thereby sequentially decode the Huffman code string of the register 2.

When the Huffman code string that is input to the register 2 from the input terminal 1 has been decoded or processed, a new Huffman code is read out from the input terminal 1. The shift controller 7 includes, though not shown, an adder for accumulating or adding code lengths output from the decoder circuit 4, so as to control the shift amount of the barrel shifter 3 in a manner as more fully described hereinafter. As is to be appreciated, the accumulated or added code length is dependent upon the bit number n. When the code string input to the decoder circuit 4 is not coincident with the Huffman code (does not hit the Huffman code), it is determined that the input Huffman code has an error. Then, the Huffman code decoder moves to the error correction processing.

Operation of the Huffman decoder will be described together with the aforementioned Huffman code string with reference to FIGS. 2A through 2D.

FIG. 2A shows the condition that the Huffman code string is input to the register 2 in the initial state. At that time, the shift amount of the barrel shifter 3 is [0] and as shown in FIG. 2A, 5 bits (maximum code length of the Huffman code) on the left end of the register 2 are input to the decoder circuit 4.

In the decoder circuit 4, since data corresponding to 2" hits (becomes coincident with) the Huffman code, data "2" is output to the data output terminal 5 and the variable length signal "3" is output to the variable length code signal output terminal 4b. Then, under the control of the controller 6, the output data "2" from the decoder circuit 4 is supplied to the next stage. Accordingly, the shift amount [3] is added within the shift controller 7.

FIG. 2B shows the next condition. As shown in FIG. 2B, the shift amount of the barrel shifter 3 is [3] and 5 bits from the fourth bit from the left of the register 2 are supplied to the decoder circuit 4. The decoder circuit 4 outputs data "3" to the data output terminal 5 and the code length signal [4] to the code length signal output terminal 4b. Then, the code length [4] is accumulated within the shift controller 7 and the shift amount becomes [7].

FIG. 2C shows the next condition. As shown in FIG. 2C, the shift amount of the barrel shifter 3 becomes [7] so that 5 bits from the 8th bit from the left of the register 2 are input to the decoder circuit 4. The aforesaid operation is continuously carried out sequentially.

A delay in a loop of the barrel shifter 3, the decoder circuit 4 and the shift controller 7 shown in FIG. 1 becomes the most important problem when the Huffman decoder is designed so as to operate at high speed. If the Huffman decoder is designed as a high speed Huffman decoder that can process one data value in one clock pulse or period, there is then a restriction such that a total sum of a delay in a large barrel shifter (about 32 bits), delays in large ROM and PLA and a logic gate and a delay occurred when the shift amounts are added within the shift controller 7 must fall within one clock period. This restriction becomes severe from a hardware design standpoint.

It is considered that the above-mentioned loop is operated by 2 clocks in order to avoid the limit provided when the Huffman decoder is operated at high speed in the critical bus. At that time, the operation efficiency of the Huffman code decoder is lowered to the half.

As a picture quality of an image to be processed becomes high and the Huffman code string supplied to the input terminal 1 becomes high in bit rate in future, it is increasingly requested that the Huffman code decoder is able to operate at high speed.

OBJECTS AND SUMMARY OF THE INVENTION

In view of the aforesaid aspects, it is an object of the present invention to provide a variable length code decoder in which the aforesaid shortcomings and disadvantages of the prior art can be eliminated.

More specifically, it is an object of the present invention to provide a variable length code decoder which can be operated at high speed without increasing a clock frequency.

According to a first aspect of the present invention, there is provided a high speed variable length code decoder which includes a first decoder circuit for decoding a leading variable length code of a variable length code string and a second decoder circuit for decoding a consecutive string of a plurality of variable length codes from the leading portion of the Huffman code string in which a plurality of data can be decoded by one decoder operation.

According to another aspect of the present invention, the second decoder is given a priority.

The variable length code decoder utilizes a Huffman code as the above variable length code.

Furthermore, according to the present invention, since a plurality of data can be decoded by one decoding operation, a high speed variable length code decoder can be realized without increasing a clock frequency.

The above and other objects, features, and advantages of the present invention will become apparent from the following detailed description of an illustrative embodiment thereof to be read in conjunction with the accompanying drawings, in which like reference numerals are used to identify the same or similar parts in the several views.

DETAILED DESCRIPTION OF THE PREFERRED EMBODIMENT

Figure 3:
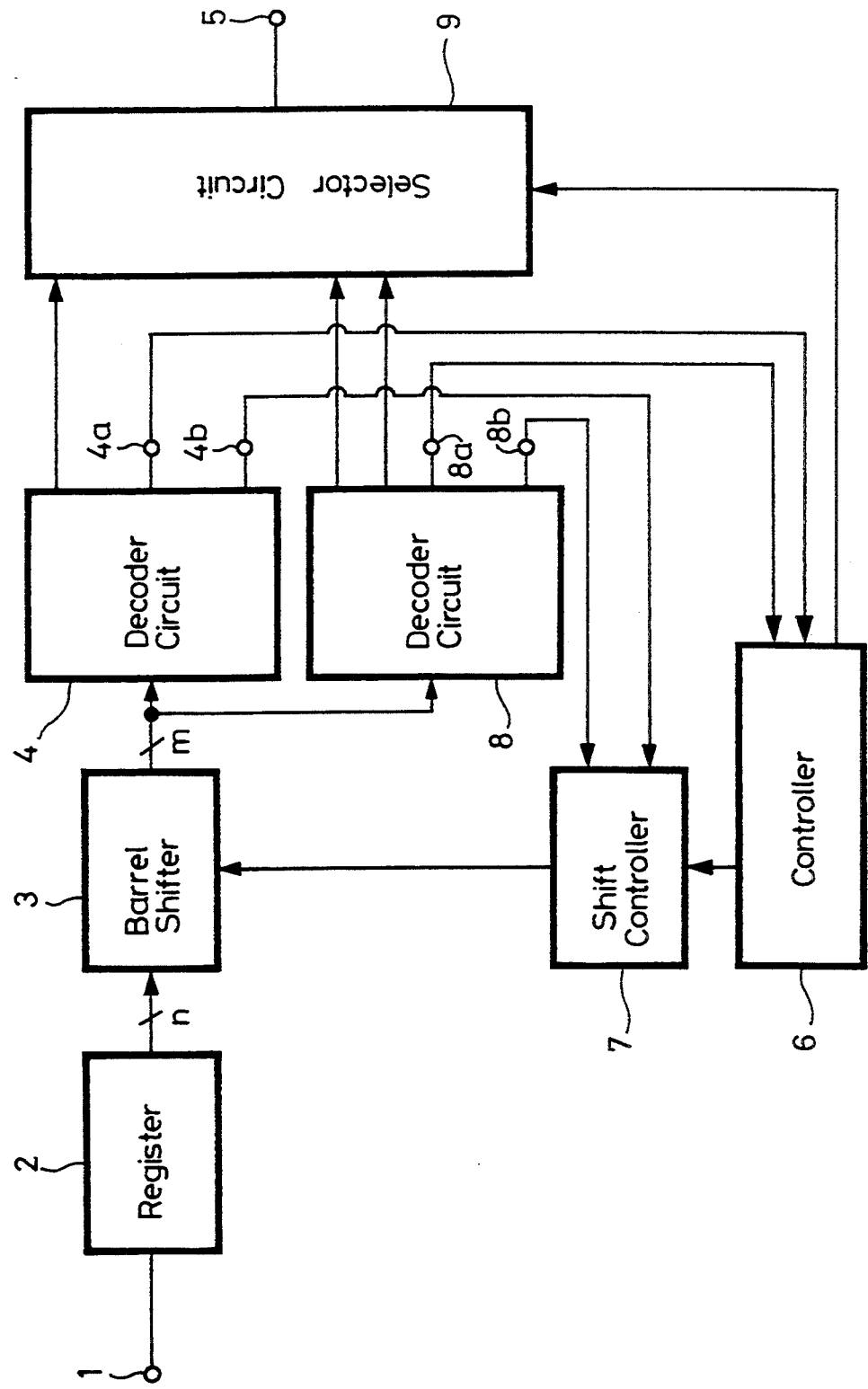
FIG. 3 is a block diagram showing a circuit arrangement of a variable length code decoder according to an embodiment of the present invention.
Figure 4:
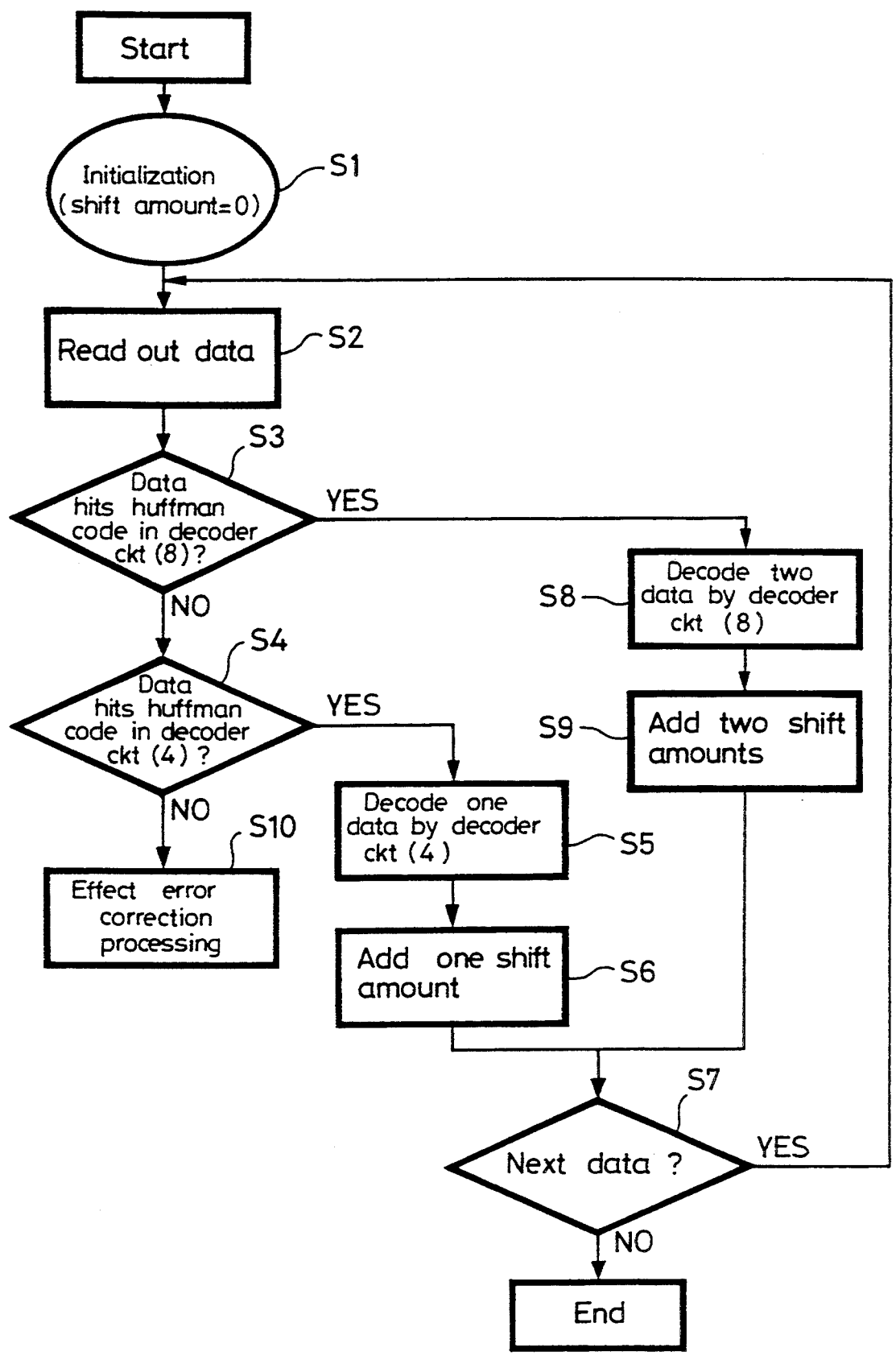
FIG. 4 is a flowchart to which references will be made in explaining operation of the variable length code decoder according to the embodiment of the present invention.

An embodiment that the variable length code decoder according to the present invention is applied to a Huffman code decoder for decoding a Huffman code will be described with reference to FIG. 3. In FIG. 3, like parts corresponding to those of FIG. 1 are marked with the same references and therefore need not be described in detail.

Figure 1:
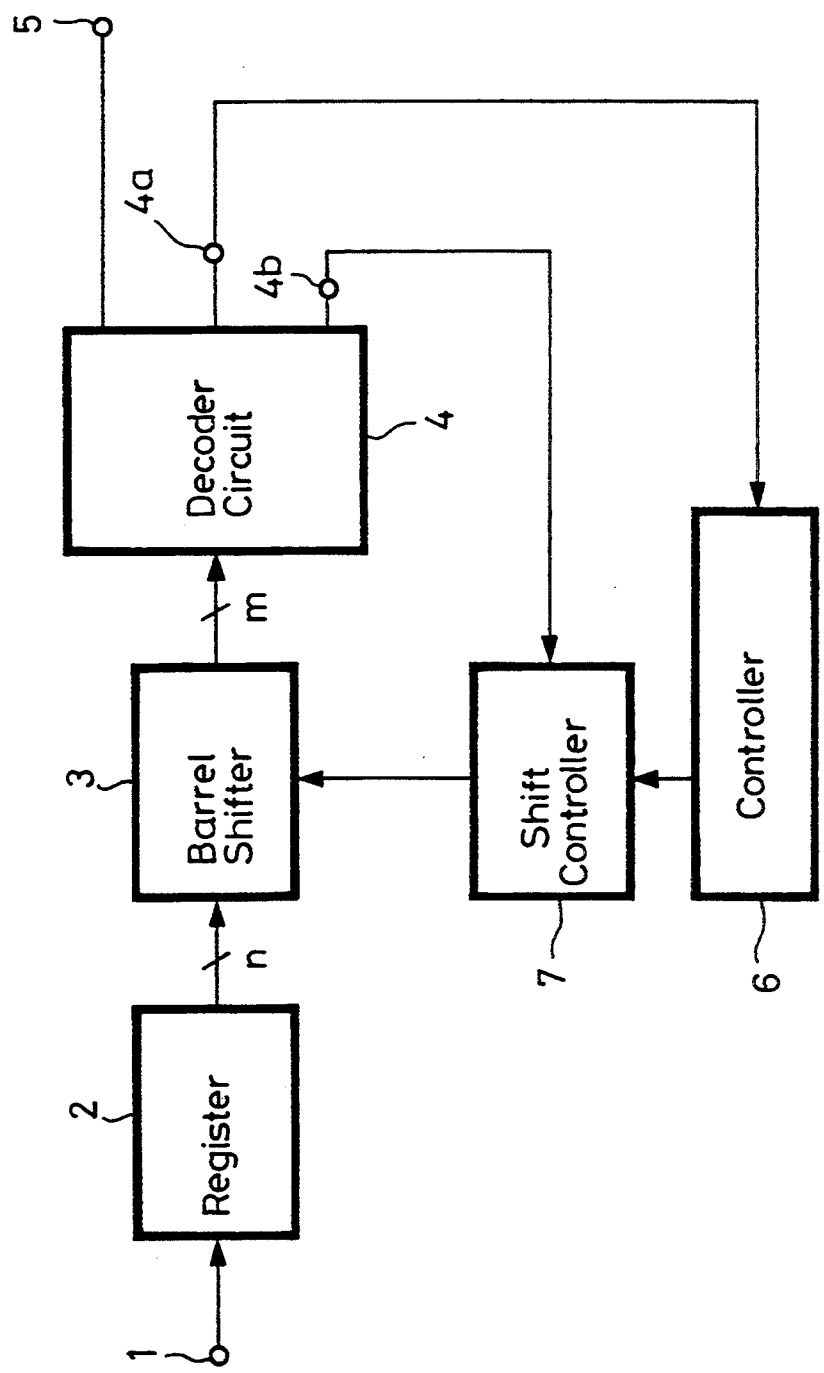
FIG. 1 is a block diagram showing a circuit arrangement of a conventional Huffman code decoder.

According to the embodiment shown in FIG. 3, the Huffman code string from the input terminal 1 is temporarily stored in the n-bit register 2 similarly to the example shown in FIG. 1. In this case, the value of n is set to be larger than the maximum length m of the Huffman code.

According to this embodiment, the m bits indicative of the maximum length of the Huffman code of n bits stored in the register 2 are supplied to the decoder circuits 4 and 8 by the barrel shifter 3 in parallel.

The barrel shifter 3 shifts the input code string by a predetermined bit number during a constant time and is capable of high speed processing as compared with a shift register that shifts one bit by one clock pulse.

The decoder circuit 4 can decode all input Huffman codes similarly to the decoder circuit shown in FIG. 1. When the decoder circuit 4 can take a simple Huffman code corresponding to five data ("0", "1", "2", "3", "4", ) as described above, the decoder circuit 4 can decode all of five Huffman codes.

When the input signal coincides with the Huffman code, the decoder circuit 4 outputs the hit signal to the hit signal output terminal 4a and also supplies the decoded data to a selector circuit 9. Further, at that time, the decoder circuit 4 outputs the code length signal indicative of the length of the Huffman code to the code length signal output terminal 4b.

The hit signal developed at the hit signal output terminal 4a is supplied to the Huffman code decoder controller 6, and the code length signal developed at the code length signal output terminal 4b is supplied to the shift controller 7.

The decoder circuit 8 can decode a consecutive string of selected two Huffman codes having a high generation frequency. For example, the decoder circuit 8 can decode only the following three strings:

| String | Huffman code string |
| --- | --- |
| "0" → "0" | [ 11] |
| "0" → "1" | [101] |
| "1" → "0" | [011] |

When the input signal coincides with a particular Huffman code string, e.g., two Huffman codes from the beginning as [11], [101] and [011], the decoder circuit 8 outputs the hit signal to a hit signal output terminal 8a, and also supplies two decoded data, e.g., "0" "0", "0" "1", and "1" "0" to the selector circuit 9. Further, the decoder circuit 8 outputs a sum code length signal of the code lengths of two Huffman codes obtained at that time to a code length signal output terminal 8b.

The hit signal obtained at the hit signal output terminal 8a is supplied to the controller 6. When the hit signal is developed at the hit signal output terminal 8a, the selector circuit 9 outputs two data obtained at the output side of the decoder circuit 8 to the data output terminal 5 with a priority under the control of the controller 6. Also, the shift controller 7 controls shift operation of the barrel shifter 3 by utilizing the sum code length signal of code lengths of two Huffman codes developed at the code length signal output terminal 8b.

When the hit signal is obtained only at the hit signal output terminal 4a, the selector circuit 9 outputs the decoded data of the decoder circuit 4 to the data output terminal 5. Also, the shift controller 7 controls the shift operation of the barrel shifter 3 by utilizing the code length signal obtained at the code length signal output terminal 4b. The rest of the arrangements in FIG. 3 is similar to that of FIG. 1.

Figure 2A:
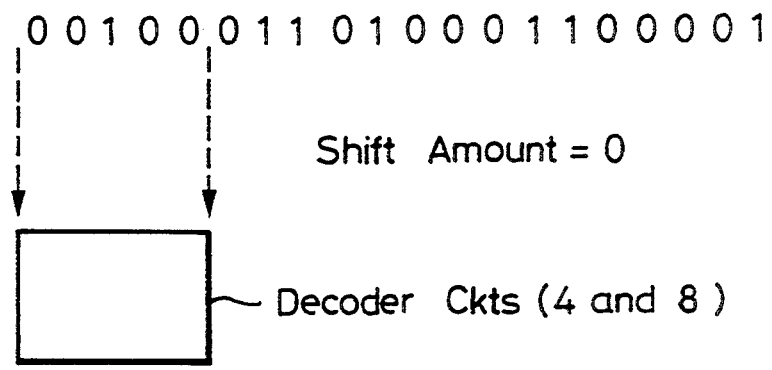
FIGS. 2A through 2D are diagrams used to explain the present invention, respectively.

Operation of the embodiment of the Huffman code decoder that decodes the Huffman code string by way of example will be described next with reference to FIG. 4 and FIGS. 2A through 2D. FIG. 2A shows the condition that the Huffman code string is input to the register 2 in the initialization state (step S1 in FIG. 4). At that time, the shift amount of the barrel shifter 3 is [0]. When data is read out at step S2, as shown in FIG. 2A, 5 bits (maximum length of Huffman code) at the left end of the register 2 are input to the decoder circuits 4 and 8.

In the decoder circuit 4, data corresponding to "2" coincides (hits) with the Huffman code (step S4) but such data does not hit the Huffman code in the decoder circuit 8 (step S3). Therefore, one data is decoded by the decoder circuit 4 (step S5) and the data "2" is output to the data output terminal 5 under the control of the controller 6. Then, [3]is supplied to the shift controller 7 as the code length signal. This shift amount is added within the shift controller 7 (step S6).

Figure 2B:
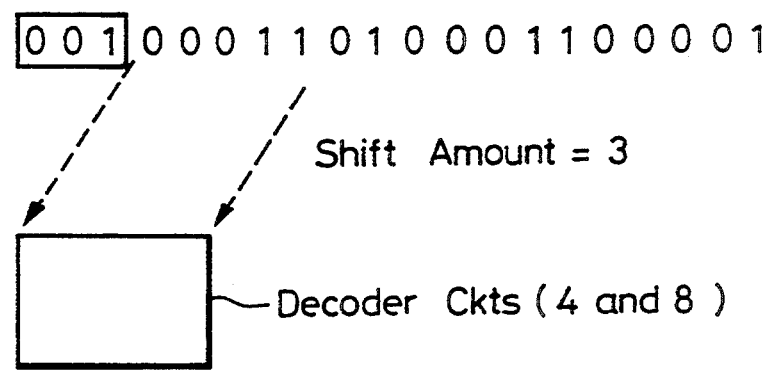

Then, the processing proceeds to the next decision step S7, whereat it is determined whether or not the next data is input to the input terminal 1. FIG. 2B shows the next condition. The shift amount of the barrel shifter 3 is [3] and 5 bits from the 4th bit of the left of the register 2 are supplied to the decoder circuits 4 and 8 (step S2). At that time, in the decoder circuit 4, data corresponding to "3" hits the Huffman code (step S4) but such data does not hit the Huffman code (step S3) in the decoder circuit 8. Therefore, one data is decoded by the decoder circuit 4 (step S5). Then, the data "3" is output to the data output terminal 5 under the control of the controller 6 and [4] is supplied to the shift controller 7 as the code length signal. This shift amount is added within the shift controller 7 (step S6).

Figure 2C:
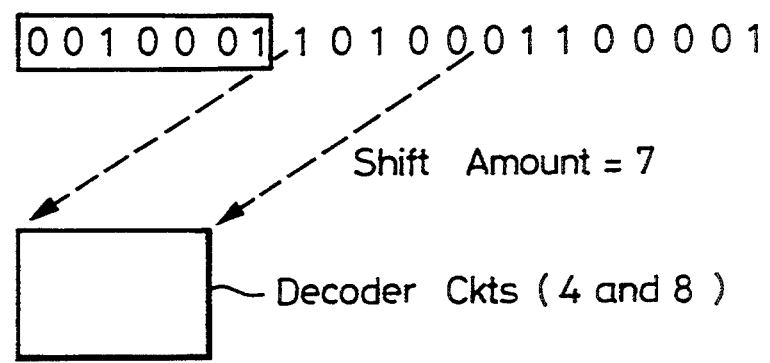

Then, the processing proceeds to decision step S7, whereat it is determined whether or not the next data is input to the input terminal 1. FIG. 2C shows the next condition. The shift amount of the barrel shifter 3 becomes [7] and therefore 5 bits from 8th bit of the left of the register 2 are supplied to the decoder circuits 4 and 8 (step S2). At that time, data corresponding to "0" hits the Huffman code in the decoder circuit 4 and data corresponding to "0" and "1" hit the Huffman code in the decoder circuit 8 (step S3). Accordingly, two data of "0" and "1" of the decoder circuit 8 are decoded with a priority under the control of the controller 6 (step S8). Then, the two data are output to the data output terminal 5 and [3] of [1]+[2] is supplied to the shift controller 7 as the code length signal. Then, the shift amount is added within the shift controller 7 (step S9).

Figure 2D:
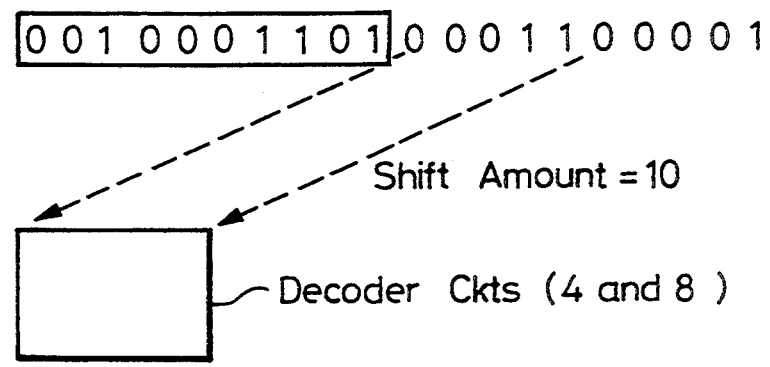

Then, the processing proceeds to the next decision step S7, whereat it is determined whether or not the next data is input to the input terminal 1. FIG. 2D shows the next condition. In this case, the shift amount of the barrel shifter 3 becomes [10] and therefore 5 bits from 11th bit of the left of the register 2 are input to the decoder circuits 4 and 8 (step S2). The aforesaid operation will hereinafter be continued sequentially. If it is determined that no next data is input to the input terminal 1 as. represented by a NO at decision step S7, the processing is ended.

When data is read out (step S2), if the read-out data does not hit the Huffman code both in the decoder circuits 4 and 8 (steps S3 and S4), then the processing proceeds to step S10, whereat the error correction processing is effected. ·

Since two data can be decoded by one decoding operation when two Huffman codes having the high generation frequency are consecutive in the Huffman code string, a high speed Huffman code decoder can be realized without increasing a clock frequency.

While the Huffman code is decoded as described above, it can be understood that the present invention can be applied to a variable length code decoder which can decode other variable length codes.

While the decoder 8 can decode the two consecutive strings as described above, the present invention is not limited thereto and the decoder circuit 8 can decode three consecutive strings or more.

According to the present invention, there is then the advantage such that the high speed variable length code decoder can be realized without increasing the clock frequency.

Having described a preferred embodiment of the invention with reference to the accompanying drawings, it is to be understood that the invention is not limited to that precise embodiment and that various changes and modifications could be effected by one skilled in the art without departing from the spirit or scope of the invention as defined in the appended claims.

What is claimed is:

1. A decoder apparatus for decoding a variable length encoded signal, said apparatus comprising:

a data register for storing therein a first predetermined number of data bits of said variable length encoded signal;

a barrel shifter receiving the stored data bits from said data register and supplying therefrom a second predetermined number of data bits;

a first decoder receiving the data bits from said barrel shifter and decoding at least a portion of such received data bits so as to produce a single decoded value;

a second decoder receiving the data bits from said barrel shifter and decoding at least a portion of such received data bits so as to produce at least two decoded values;

a selector circuit for selectively outputting one of said single decoded value from said first decoder and said at least two decoded values from said second decoder;

a shift controller for controlling a shifting operation of said barrel shifter such that the data bits supplied therefrom are shifted by a predetermined amount upon receiving an output signal from said first or second decoder; and a controller for controlling said selector circuit such that said single decoded value from said first decoder or said at least two decoded values from said second decoder are selectively output to a data output terminal in response to a hit signal supplied thereto from said first or second decoder and in accordance with a priority assigned to each said at least two decoded values so that said selector circuit outputs said at least two decoded values from said second decoder instead of said single decoded value from said first decoder when said second decoder produces said at least two decoded values and said selector circuit outputs each said single decoded value from said first decoder when said second decoder fails to produce said at least two decoded values.

2. The decoder apparatus according to claim 1, wherein said first decoder produces the single decoded value by decoding the data bits from said barrel shifter starting from a leading data bit thereof.

3. The decoder apparatus according to claim 1, wherein said second decoder produces said at least two decoded values by decoding the data bits from said barrel shifter starting from a leading data bit thereof.

4. The decoder apparatus according to claim 1, wherein said variable length encoded signal is encoded by utilizing a Huffman code.

5. The decoder apparatus according to claim 4, wherein said second predetermined number of data bits of said Huffman code is supplied from said barrel shifter to said first and second decoders in parallel.

6. The decoder apparatus according to claim 1, wherein said variable length encoded signal represents image data.

7. A decoder apparatus for decoding an encoded signal, said decoder apparatus comprising:

means for receiving said encoded signal and for supplying therefrom a predetermined number of data bits of said encoded signal;

first decoding means for decoding at least a portion of said predetermined number of data bits so as to produce a single decoded value;

second decoding means for decoding at least a portion of said predetermined number of data bits so as to produce at least two decoded values; and means for selectively supplying therefrom one of said single decoded value from said first decoding means and said at least two decoded values from said second decoding means so as to produce a decoded signal in accordance with an assigned priority, said priority being assigned to each said at least two decoded values so that said means for selectively supplying supplies therefrom said at least two decoded values from said second decoding means instead of said single decoded value from said first decoding means when said second decoding means produces said at least two decoded values and said means for selectively supplying supplies therefrom said single decoded value from said first decoding means when said second decoding means fails to produce said at least two decoded values.

8. A decoder apparatus for decoding an encoded signal, said decoder apparatus comprising:

means for receiving said encoded signal and for supplying therefrom a predetermined number of data bits of said encoded signal representing at least one data value from among a predetermined number of data values;

first decoding means for decoding at least a portion of said predetermined number of data bits so as to produce a single decoded data value;

second decoding means for decoding at least a portion of said predetermined number of data bits so as to produce at least two decoded data values, in which the data bits corresponding to each data value of said at least two decoded data values occur more frequently than the data bits corresponding to the other data values of said predetermined number of data values; and means for selectively supplying therefrom one of said single decoded data value from said first decoding means and said at least two decoded data values from said second decoding means so as to produce a decoded signal.

9. A decoder apparatus for decoding a signal encoded with a variable length code, said decoder apparatus comprising:

data register means for receiving the encoded signal and for storing the received encoded signal therein;

barrel shifter means for receiving the stored encoded signal from said data register means and for supplying therefrom a group of data bits of said stored encoded signal, said group having a predetermined number of data bits which represent at least one data value from among a plurality of data values;

first decoding means for decoding at least a portion of said group of data bits so as to produce a single decoded data value, said first decoding means producing a first hit signal and a first code length signal representative of the number of data bits included in the respective decoded portion of said group of data bits upon producing said single decoded data value;

second decoding means for decoding at least a portion of said group of data bits so as to produce at least two decoded data values, said second decoding means producing a second hit signal ad a second code length signal representative of the number of data bits included in the respective decoded portion of said group of data bits upon producing said at least two decoded data values;

selector means for selectively supplying therefrom one of said single decoded data value from said first decoding means and said at least two decoded data values from said second decoding means so as to produce a decoded signal in accordance with an assigned priority; and control means, responsive to said first and second hit signals and said first and second code length signals, for controlling mans selector means in accordance with said assigned priority such that said at least two decoded data values from said second decoding means are supplied therefrom instead of said signal decoded data value from said first decoding means when said second decoding means produces said at least two decoded data values and such that said single decoded data value from said first decoding means is supplied therefrom when said second decoding means fails to produce said at least two decoded data values and for controlling said barrel shifter means so as to cause another group of data bits to be supplied therefrom.

10. A decoder apparatus according to claim 9, wherein the data bits corresponding to each data value of the at least two decoded data values produced by said second decoding means occur more frequently than the data bits corresponding to the other data values of said plurality of data values.

* * * * *